US012782814B2

(12) United States Patent
Ido et al.

(10) Patent No.: US 12,782,814 B2
(45) Date of Patent: Nov. 3, 2026

(54) PHOTOSENSITIVE RESIN PRINTING PLATE PRECURSOR, AND METHOD OF MANUFACTURING PRINTING PLATE USING SAID PRECURSOR

(71) Applicant: Toray Industries, Inc., Tokyo (JP)

(72) Inventors: Kenji Ido, Okazaki (JP); Tsutomu Abura, Okazaki (JP); Norihito Tachi, Okazaki (JP)

(73) Assignee: Toray Industries, Inc., Tokyo (JP)

( * ) Notice: Subject to any disclaimer, the term of this patent is extended or adjusted under 35 U.S.C. 154(b) by 743 days.

(21) Appl. No.: 18/042,309

(22) PCT Filed: Jul. 26, 2021

(86) PCT No.: PCT/JP2021/027474

§ 371 (c)(1),
(2) Date: Feb. 21, 2023

(87) PCT Pub. No.: WO2022/054427

PCT Pub. Date: Mar. 17, 2022

(65) Prior Publication Data

US 2023/0333473 A1 Oct. 19, 2023

(30) Foreign Application Priority Data

Sep. 14, 2020 (JP) ................................ 2020-153534

(51) Int. Cl.

| | |
|---|---|
| ***G03F 7/09*** | (2006.01) |
| ***G03F 7/038*** | (2006.01) |
| ***G03F 7/12*** | (2006.01) |
| ***G03F 7/20*** | (2006.01) |

(52) U.S. Cl.
CPC .............. *G03F 7/094* (2013.01); *G03F 7/038* (2013.01); *G03F 7/12* (2013.01); *G03F 7/2004* (2013.01)

(58) Field of Classification Search
CPC ........................................................ G03F 7/12
See application file for complete search history.

(56) References Cited

U.S. PATENT DOCUMENTS

| | | | |
|---|---|---|---|
| 5,252,428 | A | 10/1993 | Kawamoto et al. |
| 2019/0039397 | A1 | 2/2019 | Kawahara et al. |

FOREIGN PATENT DOCUMENTS

| | | | | | |
|---|---|---|---|---|---|
| CN | 107924129 | A | * | 4/2018 | ............ G03F 7/038 |
| JP | 58-160956 | A | | 9/1983 | |
| JP | S59-102228 | A | | 6/1984 | |
| JP | H02-000970 | A | * | 1/1990 | |
| JP | 04-095959 | A | | 3/1992 | |
| JP | 05002266 | A | | 1/1993 | |
| JP | 10-274842 | | | 10/1998 | |
| JP | 2006-184615 | | | 7/2006 | |
| JP | 2006184615 | A | * | 7/2006 | |
| JP | 2014-162156 | | | 9/2014 | |
| JP | 2015158551 | A | * | 9/2015 | |
| JP | 2018-141977 | A | | 9/2018 | |
| JP | 2019152827 | A | | 9/2019 | |
| JP | 2019218454 | A | | 12/2019 | |
| WO | 2017/038970 | | | 3/2017 | |
| WO | WO-2019139055 | A1 | * | 7/2019 | ........... C09J 133/00 |
| WO | 2020/085500 | A1 | | 4/2020 | |

OTHER PUBLICATIONS

Communication Pursuant to Rule 114(2) EPC dated Jul. 26, 2024, of counterpart European Patent Application No. 2186387.0.
Office Action dated Sep. 24, 2025, from counterpart Japanese Application No. 2021-543349.
Extended European Search Report dated Feb. 12, 2024, of counterpart European Patent Application No. 21866387.0.
International Search Report dated Sep. 28, 2021, in International Application No. PCT/JP2021/027474, with English Translation.
Notice of Reasons for Refusal dated Apr. 23, 2024, of counterpart Japanese Patent Application No. 2021-543349, along with an English machine translation.
Notice of Submission of Publications dated Mar. 12, 2024, of counterpart Japanese Patent Application No. 2021-543349, along with an English machine translation.

* cited by examiner

*Primary Examiner* — Chanceity N Robinson
(74) *Attorney, Agent, or Firm* — DLA Piper LLP (US)

(57) ABSTRACT

A photosensitive resin printing plate precursor includes at least a support and a photosensitive resin layer, wherein the photosensitive resin layer contains at least a polymer (A) having an ethylenic double bond, a compound (B) having an ethylenic double bond, and a photopolymerization initiator (C); wherein the photosensitive resin layer includes at least a first photosensitive resin layer including a printing surface, and a second photosensitive resin layer including the interior of the photosensitive resin layer; and wherein the ethylenic double bond equivalent F1 (g/eq) of component (A) in the first photosensitive resin layer is higher than the ethylenic double bond equivalent F2 (g/eq) of component (A) in the second photosensitive resin layer.

13 Claims, No Drawings

PHOTOSENSITIVE RESIN PRINTING PLATE PRECURSOR, AND METHOD OF MANUFACTURING PRINTING PLATE USING SAID PRECURSOR

TECHNICAL FIELD

This disclosure relates to a photosensitive resin printing plate precursor, and a method of producing a printing plate using the same.

BACKGROUND

To form a relief in a photosensitive resin printing plate precursor, a method is commonly used in which UV light is irradiated to a photosensitive resin layer through an image mask or an original film to selectively cure an image portion, and the uncured portion of the layer is removed using a developer.

A photosensitive resin printing plate precursor including at least a support and a photosensitive resin layer is proposed, as a technique for improving the printing durability of a photosensitive resin printing plate in which a relief is formed, wherein the photosensitive resin layer contains a partially saponified polyvinyl alcohol compound, a basic nitrogen-containing polyamide, a compound having an ethylenic double bond, and a photopolymerization initiator; wherein the photosensitive resin layer includes at least a lower layer and a printing surface layer, and includes the support, the lower layer and the printing surface layer in the order mentioned; and wherein the photosensitive resin layer contains, as the partially saponified polyvinyl alcohol compound, a partially saponified polyvinyl alcohol having an average degree of polymerization of from 1,200 to 2,600 in the printing surface layer, and one having an average degree of polymerization of from 400 to 800 in the lower layer (see, for example, WO 2017/038970).

We found out that while the printing durability can be improved by the photosensitive resin printing plate precursor disclosed in WO 2017/038970, there is a problem that interlayer delamination is more likely to occur in the photosensitive resin layer, partially or over the entire layer, in the plate making step of forming a relief. The reason for this is thought to be as follows: since the partially saponified polyvinyl alcohol compound in the printing surface layer has a high crosslinking density, the photocuring of the molecules of the partially saponified polyvinyl alcohol compound in the printing surface layer proceeds preferentially by exposure, making the photocuring of the partially saponified polyvinyl alcohol compound in the lower layer to proceed less easily. Thus, when a developer infiltrates between the printing surface layer and the lower layer, by the development, the printing surface layer is more likely to peel off in the form of a film, resulting in the occurrence of interlayer delamination.

It could therefore be helpful to provide a photosensitive resin printing plate precursor in which the delamination of the photosensitive resin layer can be reduced.

SUMMARY

We thus provide:

A photosensitive resin printing plate precursor including at least a support and a photosensitive resin layer, wherein 1) the photosensitive resin layer contains at least:
   - a polymer (A) having an ethylenic double bond;
   - a compound (B) having an ethylenic double bond; and
   - a photopolymerization initiator (C);

2) the photosensitive resin layer includes at least:
   - a first photosensitive resin layer including a printing surface; and
   - a second photosensitive resin layer including an interior of the photosensitive resin layer; and
3) the ethylenic double bond equivalent F1 (g/eq) of component (A) (A-1) in the first photosensitive resin layer, is higher than the ethylenic double bond equivalent F2 (g/eq) of component (A) (A-2) in the second photosensitive resin layer The photosensitive resin printing plate precursor enables reduction in delamination of the photosensitive resin layer.

DETAILED DESCRIPTION

Our photosensitive resin printing plate precursor (also "printing plate precursor") includes at least a support and a photosensitive resin layer. The "photosensitive resin layer" refers to a layer containing a polymer (A) having an ethylenic double bond, a compound (B) having an ethylenic double bond, and a photopolymerization initiator (C), which are described later. When the photosensitive resin printing plate precursor includes the photosensitive resin layer, it is possible to form a desired relief on a support, for example, by irradiating UV light in the form of an image. The photosensitive resin printing plate precursor may include two or more photosensitive resin layers. The support has a function of retaining the photosensitive resin layer or the relief.

The photosensitive resin layer contains at least a polymer (A) (also "component (A)") having an ethylenic double bond, a compound (B) (also "component (B)") having an ethylenic double bond, and a photopolymerization initiator (C) (also "component (C)"). When light is irradiated to the photosensitive resin layer, free radicals are generated from the component (C) in the photosensitive resin layer. The thus generated free radicals and the molecules of the component (B) and/or the component (A) undergo radical polymerization, making it possible to form a relief for obtaining a desired printed image by forming cross-linked structures. Further, the component (A) serves as a matrix for the photosensitive resin layer and the relief, and has a function of providing structural strength thereto. In addition, when the component (A) has an ethylenic double bond, it is possible to allow the photocuring to further proceed and improve image reproducibility by the radical polymerization with the component (C).

The component (A) refers to a component having an ethylenic double bond and having a weight average molecular weight of 10,000 or more. The weight average molecular weight of the component (A) as used herein can be obtained by GPC measurement. The weight average molecular weight is measured using a gel permeation chromatograph equipped with a multi-angle light scattering photometer, manufactured by Wyatt Technology Corporation, under the conditions of a column temperature of 40° C. and a flow velocity of 0.7 mL/min.

The component (A) is preferably dissolvable or dispersible in a solvent used as a developer. Examples of such a polymer include styrene-butadiene copolymers, polybutadiene latexes, styrene-butadiene copolymer latexes, acrylonitrile-butadiene copolymer latexes, methyl methacrylate-butadiene copolymer latexes, polyurethanes, cellulose derivatives, polyesters, polyacrylic acid derivatives, polyvinyl acetate, polyvinyl alcohol, polyvinylpyrrolidone and polyamides. Two or more kinds of these polymers may be used. Among these, a polymer dispersible or dissolvable in water is preferred, since such a polymer can contribute to reducing the environmental burden and reducing impacts on human body. The polymer dispersible or dissolvable in water is preferably a polymer having a hydrophilic group, a polymer in which the polymer main chain itself is water swellable or water soluble. Examples of the hydrophilic group include carboxyl group, amino group, hydroxyl group, phosphoric acid group, sulfonic acid group, and salts of these groups. Examples of the polymer having a hydrophilic group include carboxylated styrene-butadiene latexes, aliphatic conjugated diene polymers having a carboxyl group, emulsion polymers of ethylenically unsaturated compounds having a phosphoric acid group and/or a carboxyl group, and sulfonic acid group-containing polyurethanes. Examples of the a polymer in which the polymer main chain itself is water swellable or water soluble include polyvinyl alcohol, partially saponified polyvinyl alcohols, vinyl alcohol-sodium acrylate copolymers, vinyl alcohol-sodium methacrylate copolymers, polyvinylpyrrolidone, polyether-containing polyamides, tertiary nitrogen atom-containing polyamides, polyethers, cellulose, hydroxyethyl cellulose, hydroxypropyl cellulose, carboxymethyl cellulose, starch, grafted products of starch-sodium polyacrylate, saponification products of grafted products of starch-polyacrylonitrile, grafted products of cellulose-polyacrylic acid, partially cross-linked sodium polyacrylate, polyethylene glycol and polyethylene glycol derivatives. Among these, polyvinyl alcohol or a partially saponified polyvinyl alcohol is preferably used, from the viewpoints of being available industrially and inexpensively, and being able to further improve the image reproducibility due to its high solubility in water. From the viewpoints of having a high physical strength and thus being able to further improve the printing durability, and having a good balance between the strength and the solubility in a solvent, a tertiary nitrogen atom-containing polyamide is preferred. A partially saponified polyvinyl alcohol is more preferred.

The component (A) preferably has an ethylenic double bond in a side chain, from the viewpoint of further improving the image reproducibility. Examples of the group having an ethylenic double bond include vinyl group, acryloyl group and methacryloyl group. The component (A) may have two or more kinds of these groups.

Examples of the method of introducing an ethylenic double bond into the above-described polymer include, when using a partially saponified polyvinyl alcohol, for example: (1) a method in which a partially saponified polyvinyl alcohol is allowed to react with an acid anhydride, and a reactive group such as carboxyl group is introduced into a side chain of the polymer with the hydroxyl group of the partially saponified polyvinyl alcohol as a starting point, and an unsaturated epoxy compound is allowed to react with the reactive group; and (2) a method in which a copolymer of vinyl acetate with an unsaturated carboxylic acid, an unsaturated carboxylate and/or unsaturated carboxylic acid ester is partially saponified, and an unsaturated epoxy compound is allowed to react with a carboxyl group in this polymer. When using a polyamide, examples of the method include a method in which a structure containing a tertiary nitrogen atom such as a piperazine ring, is introduced into the polyamide skeleton, and an ethylenic double bond is added thereto by the quaternization of the nitrogen atom using glycidyl methacrylate and/or glycidyl acrylate.

It is necessary that the ethylenic double bond equivalent of the component (A) in the surface (also "printing surface") on the side opposite to the support of the photosensitive resin layer be higher than the ethylenic double bond equivalent of the component (A) in the interior of the photosensitive resin layer. As described above, when the component (A) in the printing surface in the photosensitive resin layer has a high crosslinking density, the photocuring in the printing surface proceeds preferentially by exposure, making the photocuring in the interior of the photosensitive resin layer to proceed less easily. In this example, a developer infiltrates between the interior of the photosensitive resin layer and the printing surface by the development, making the printing surface more likely to peel off. It is possible to allow the photocuring of the component (A) to proceed uniformly from the printing surface to the interior of the photosensitive resin layer by decreasing the crosslinking density of the printing surface with respect to that of the interior of the photosensitive resin layer, that is, by adjusting the ethylenic double bond equivalent of the component (A) in the printing surface to be higher than the ethylenic double bond equivalent of the component (A) in the interior of the photosensitive resin layer. This is because the problems that the light irradiated from the side of the printing surface attenuates when passing through the photosensitive resin layer, and that radicals are less likely to be produced in the interior of the layer compared to the printing surface, can be solved by increasing the crosslinking density of the interior of the photosensitive resin layer, and the interior of the photosensitive resin layer can be sufficiently photocured. By this arrangement, the delamination of the photosensitive resin layer can be reduced.

The photosensitive resin layer includes at least a first photosensitive resin layer (also "first layer") including the printing surface, and a second photosensitive resin layer (also "second layer") including the interior of the photosensitive resin layer. From the above-mentioned viewpoints, it is necessary that the ethylenic double bond equivalent F1 (g/eq) of component (A) (A-1) in the first layer be higher than the ethylenic double bond equivalent F2 (g/eq) of component (A) (A-2) in the second layer. By this arrangement, the delamination of the photosensitive resin layer can be reduced.

The ethylenic double bond equivalent of the component (A) is represented by the polymer molar weight per mole of ethylenic double bonds in the polymer of the component (A). The "printing surface" described above refers to the portion of the photosensitive resin layer extending from the surface on the side opposite to the support, to a depth of 5 μm toward the support. Further, the "interior of the photosensitive resin layer" refers to the portion of the photosensitive resin layer extending from a position at a depth of 50 μm to a position at a depth of 100 μm from the interface between the layer and the support toward the printing surface. When the structure of the component (A) is known, the ethylenic double bond equivalent thereof can be calculated by dividing the theoretical weight per mole of the component (A) by the number of ethylenic double bonds contained in one polymer molecule. Further, the ethylenic double bond equivalent can be calculated by analyzing the number of moles of ethylenic double bonds in the polymer by $^{1}$H-NMR, and dividing the weight of the sample used in the analysis by the number of moles of ethylenic double bonds detected.

F1 is preferably 1,000 g/eq or more and 19,000 g/eq or less. When F1 is adjusted to 1,000 g/eq or more, the hardness of the relief surface of the resulting printing plate can be moderately reduced, and the printing reproducibility can be improved. On the other hand, when F1 is adjusted to 19,000 g/eq or less, it is possible to allow the photocuring of the printing surface to proceed sufficiently, and to further improve the image reproducibility and the printing durability.

F2 can be selected arbitrary within such a range that F1 becomes higher than F2.

The ratio (F1/F2) of F1 to F2 is preferably more than 1.0 and 5.0 or less. When the ratio F1/F2 is adjusted to 5.0 or less, the crosslinking density of the printing surface in the photosensitive resin layer can be moderately increased, and the image reproducibility can further be improved.

The weight average molecular weight M1 of the component A-1 is preferably equal to or higher than the weight average molecular weight M2 of the component A-2. In the development step to be described later, the uncured portion of the photosensitive resin layer is removed. In this step, there is a tendency that the lower the weight average molecular weight of the component (A), the easier the uncured portion is removed. In particular, when the component (A) in the interior of the photosensitive resin layer has a lower weight average molecular weight, the unexposed portion is more easily removed within a shorter period of time, including the region closer to the support, enabling to shorten the development time. In the printing surface which comes into contact with a developer, on the other hand, the component (A) preferably has a high weight average molecular weight, from the viewpoint of improving the resistance to the developer. Therefore, the ratio (M1/M2) of M1 to M2 is preferably 1.0 or more and 6.5 or less. When the ratio M1/M2 is adjusted to 1.0 or more, the printing durability can further be improved. On the other hand, when the ratio M1/M2 is adjusted to 6.5 or less, the difference in developability between the first layer and the second layer can be decreased to maintain the development time moderately short, and the delamination of the photosensitive resin layer can further be reduced. M1 and M2 as used herein can be measured, as described above, by the GPC measurement.

The weight average molecular weight M1 of the component A-1 is preferably 20,000 or more, and more preferably 70,000 or more, from the viewpoints of further reducing the delamination of the photosensitive resin layer, and further improving the printing durability. From the viewpoint of the workability of the photosensitive resin layer, on the other hand, M1 is preferably 200,000 or less.

M2 can be selected arbitrarily so that M1 and M2 preferably satisfy the relationship described above.

It is preferred that the first layer and the second layer are adjacent to each other. When the first layer and the second layer are directly adjacent to each other, the component (A) (A-2) in the second layer having a high crosslinking density, directly forms a chemical bond with the component (A) (A-1) in the first layer including the printing surface, by exposure, making it possible to fix the first layer more firmly, and to further reduce the delamination of the photosensitive resin layer.

The first layer preferably has a thickness of 5 μm or more, because chipping in the development step can be reduced. On the other hand, the first layer preferably has a thickness of 100 μm or less, because it becomes easier to sufficiently photocure the second layer even at a low irradiation dose of actinic radiation, the adhesion with the second layer can further be improved, and the interlayer delamination of the photosensitive resin layer can further be reduced.

The second layer preferably has a thickness of 100 μm or more, because a sufficient height of the relief of the printing plate can be ensured, to reduce the so-called bottoming phenomenon, which is a phenomenon in which ink adheres to the surface of the support during printing. On the other hand, the second layer preferably has a thickness of 2.0 mm or less, because the printing reproducibility can be improved.

The "compound (B) having an ethylenic double bond" refers to a compound having an ethylenic double bond and having a molecular weight of less than 10,000. The component (B) preferably has a molecular weight of 2,000 or less.

Examples of the component (B) include (meth)acrylate as described in WO 2017/038970, glycerol di(meth)acrylate, an (meth)acrylic acid adduct of propylene glycol diglycidyl ether and tetrahydrofurfuryl (meth)acrylate. The photosensitive resin layer may contain two or more kinds of these compounds. The term "(meth)acrylate" as used herein is a generic term referring to both acrylate and methacrylate, and the term "(meth)acrylic acid" is a generic term referring to both acrylic acid and methacrylic acid.

The content of component (B) in the photosensitive resin layer is preferably from 5 to 200 parts by mass with respect to 100 parts by mass of the component (A).

As the photopolymerization initiator (C), a photopolymerization initiator which has the function of generating radicals by autolysis or hydrogen abstraction due to photoabsorption is preferably used. Examples thereof include benzoin alkyl ethers, benzophenones, anthraquinones, benzyls, acetophenones and diacetyls. The photosensitive resin layer may contain two or more kinds of these photopolymerization initiators.

The content of the component (C) in the photosensitive resin layer is preferably from 0.1 to 20 parts by mass with respect to 100 parts by mass of the component (A).

If necessary, the photosensitive resin layer may contain a compatibility aid, a polymerization inhibitor, a dye, a pigment, a surfactant, an antifoaming agent, an ultraviolet absorber, a perfume and/or the like, along with the components (A) to (C) described above.

When the photosensitive resin layer contains a compatibility aid, it is possible to increase the compatibility between the components included in the photosensitive resin layer, reduce the bleeding out of low-molecular weight components, and improve the flexibility of the photosensitive resin layer. Examples of the compatibility aid include polyols such as ethylene glycol, diethylene glycol, triethylene glycol, glycerin, trimethylolpropane, trimethylolethane and pentaerythritol, and derivatives thereof. The content of the compatibility aid in the photosensitive resin layer is preferably 30% by mass or less.

When the photosensitive resin layer contains a polymerization inhibitor, the thermal stability can be improved. Examples of the polymerization inhibitor include phenols, hydroquinones, catechols and hydroxyamine derivatives. The photosensitive resin layer may contain one or more kinds of these polymerization inhibitors. The content of the polymerization inhibitor in the photosensitive resin layer is preferably from 0.001 to 5% by mass.

The support may be, for example, a plastic sheet made of a polyester or the like, a synthetic rubber sheet made of a styrene-butadiene rubber or the like, a metal plate made of steel, stainless steel, aluminum or the like.

The support preferably has a thickness of 100 to 350 μm, from the viewpoints of handleability and flexibility.

The support is preferably subjected to a treatment for facilitating adhesion, because the adhesion with the photosensitive resin layer can be improved. The treatment for facilitating adhesion may be, for example, a mechanical treatment such as sand blasting, a physical treatment such as corona discharge, or a chemical treatment such as coating.

Among these, it is preferred to form an easily-adhesive layer by coating, from the viewpoint of improving the adhesion.

If necessary, the printing plate precursor may include, in addition to the support and the photosensitive resin layer described above, a cover film and/or a thermosensitive mask layer on the photosensitive resin layer.

When the photosensitive resin printing plate precursor includes a cover film on the photosensitive resin layer, it is possible to protect the surface of the photosensitive resin layer and to inhibit the adhesion of foreign substances and the like. The photosensitive resin layer may be in direct contact with the cover film, or alternatively, one or more layers, such as an anti-sticking layer and/or the like, may be provided between the photosensitive resin layer and the cover film.

The cover film may be, for example, a plastic sheet made of a polyester, polyethylene, polypropylene or the like. The cover film preferably has a thickness of 10 to 150 m, from the viewpoints of handleability and flexibility. The surface of the cover film may be subjected to roughening so that the adhesion with an original film can be improved. The roughening can be performed, for example, by a method such as sand blasting, chemical etching, or coating with a matting particle-containing coating agent.

Further, when the photosensitive resin printing plate precursor is used in the so-called CTP plate-making process, in which laser irradiation is carried out based on image data controlled by a digital device, and an image mask is formed on site from mask layer components, followed by exposure and development, the printing plate precursor may further include a thermosensitive mask layer. The thermosensitive mask layer is preferably a layer which virtually blocks UV light, which absorbs infrared laser light during drawing, and a part or the entirety of which is instantaneously sublimated or ablated by the heat thereby produced. The use of such a thermosensitive mask layer causes a difference in the optical density between the laser-irradiated and non-irradiated portions to occur, and the same function as a conventional original film can be achieved. When the printing plate precursor includes a thermosensitive mask layer, the printing plate precursor may include an adhesion adjustment layer between the photosensitive resin layer and the thermosensitive mask layer, and may include a peeling auxiliary layer between the thermosensitive mask layer and the cover film.

Examples of the thermosensitive mask layer, the adhesion adjustment layer and the peeling auxiliary layer include those disclosed in WO 2017/038970.

Next, the methods of producing photosensitive resin compositions and a printing plate precursor will be described, wherein the printing plate precursor includes the first layer, the second layer and a cover film, on a support, as an example.

For example, the component (A) having the double bond equivalent F1, the component (B), the component (C), and another additive(s), if necessary, are dissolved in a solvent with heating, to obtain a photosensitive resin composition solution for forming the first layer. Further, a photosensitive resin composition solution for forming the second layer is obtained in the same manner as that for the first layer, except for using the component (A) having the double bond equivalent F2. The solvent to be used may be, for example, a mixed solvent of water and alcohol or the like.

The photosensitive resin composition solution for forming the second layer is coated by flow casting, on a support which has an easily-adhesive layer as necessary, and then dried, to form the second layer. Subsequently, the photosensitive resin composition solution for forming the first layer is coated by flow casting on the second layer, and then dried, to form the first layer. Further, a cover film coated with an anti-sticking layer as necessary, can be brought into close contact with the surface of the first layer, to obtain a printing plate precursor.

Next, the method of producing a printing plate using the printing plate precursor will be described. The production method includes:

- an exposure step of irradiating UV light to at least the photosensitive resin layer of the printing plate precursor, to photocure the exposed portion of the photosensitive resin layer; and
- a development step of removing the uncured portion of the photosensitive resin layer, using at least water and/or an organic solvent.

In the exposure step, a negative or positive original film is brought into close contact with the surface of the photosensitive resin layer whose cover film, when having one, has been peeled off, and UV light with a wavelength of 300 to 400 nm is irradiated thereto, to photocure the exposed portion of the photosensitive resin layer. It is preferred to use, for example, a high-pressure mercury lamp, an ultra-high pressure mercury lamp, a metal halide lamp, a xenon lamp, a carbon arc lamp, a chemical lamp, a UV-LED lamp or the like, for the UV light irradiation.

In the development step, the uncured portion is preferably dissolved by a spray development apparatus or a brush washing machine. Of these, development by a brush washing machine is preferred, because the uncured portion of the photosensitive resin layer can be removed efficiently.

The production method may further include a post-exposure step of irradiating UV light after the development, if necessary. The post-exposure step allows the unreacted component (B) to react, enabling the formation of a more rigid relief.

A printing plate produced using the photosensitive resin printing plate precursor can be used, for example, in a letterpress printing application, a dry offset printing application, or a flexographic printing application using a rotary printing press, an intermittent rotary printing press or the like for printing labels. Among these, the printing plate can be suitably used in a letterpress printing application or a dry offset printing application. Particularly in dry offset printing, ink is delivered and received between the printing plate and a blanket having a high elasticity, and therefore, there is a tendency that minute defects on the surface of the printing plate are more likely to be transferred to an object to be printed. Since the delamination of the photosensitive resin layer can be reduced in the printing plate, printing defects due to the delamination of the photosensitive resin layer can be reduced in a dry offset printing application, and accordingly, the printing plate can be more suitably used.

The object to be printed by dry offset printing is preferably a metal can such as a two-piece can, which is widely used as a beverage container. In general, a high printing durability is required in the printing of two-piece metal cans, since the printing of several million cans, on a hard metal, is continuously performed. Printing defects due to the interlayer delamination of the photosensitive resin layer can be reduced.

EXAMPLES

Our precursors and methods will now be specifically described with reference to Examples. However, this disclosure is in no way limited to these Examples. Evaluation methods used in Examples and Comparative Examples are shown below.

(1) Ethylenic Double Bond Equivalent of Component (A)

A solution of the component (A) prepared in each of the Examples and Comparative Examples was coated by bar coating, to prepare a dry coating film having a thickness of 300 m. A quantity of 100 mg of the dry coating film was dissolved in a mixed solvent of deuterated water and deuterated methanol, to which 3-(trimethylsilyl)sodium propionate-2,2,3,3$d_4$, as an internal standard, had been added, and $^1$H-NMR measurement was carried out to measure the number of moles of ethylenic double bonds. The ethylenic double bond equivalent of the component (A) was calculated by dividing the weight of the component (A) in the sample used in the analysis, by the number of moles of ethylenic double bonds detected.

(2) Weight Average Molecular Weight of Component (A)

Each dry coating film obtained by the method described in the section (1) above was subjected to GPC measurement using a gel permeation chromatograph equipped with a multi-angle light scattering photometer, manufactured by Wyatt Technology Corporation, under the conditions of a column temperature of 40° C. and a flow velocity of 0.7 mL/min, to measure the weight average molecular weight of the component (A).

(3) Delamination of Photosensitive Resin Layer

The cover film was peeled off from the printing plate precursor obtained in each of the Examples and Comparative Examples. At this time, only the polyester film was peeled off, and a partially saponified polyvinyl alcohol film having a dried film thickness of 1 μm remained on the photosensitive resin layer.

A negative film containing an outline fine-line image with a width of 300 μm and a gray scale negative film for measuring sensitivity were vacuum-adhered in close contact onto the photosensitive resin layer having the partially saponified polyvinyl alcohol film thereon, followed by exposure under the conditions to achieve a gray scale sensitivity of 16±1 level, using a chemical lamp FL20SBL-360, 20 Watt (manufactured by Mitsubishi Electric Osram Ltd.). Thereafter, a brush washing machine was used as a development apparatus to perform development with water at a temperature of 35° C. to 40° C., followed by drying at 60° C. for 10 minutes, to obtain a printing plate. The relief surface of each resulting printing plate was observed using a loupe with a magnification of 25 times, and the presence or absence of the delamination of the photosensitive resin layer was evaluated. The delamination of the photosensitive resin layer as used herein includes the interlayer delamination between the first layer and the second layer. Evaluation results are shown in Tables 1 to 3, in which "Absent" indicates that no delamination was observed, "Present" indicates that delamination was observed.

(4) Image Reproducibility

The cover film was peeled off from the printing plate precursor obtained in each of the Examples and Comparative Examples. At this time, only the polyester film was peeled off, and a partially saponified polyvinyl alcohol film having a dried film thickness of 1 μm remained on the photosensitive resin layer.

A negative film for evaluating image reproducibility containing a 3% halftone dot image with 150 lines, and a gray scale negative film for measuring sensitivity were vacuum-adhered in close contact onto the photosensitive resin layer having the partially saponified polyvinyl alcohol film thereon, followed by exposure under the conditions to achieve a gray scale sensitivity of 16±1 level, using a chemical lamp FL20SBL-360, 20 Watt (main exposure). Thereafter, a brush washing machine was used as a development apparatus to perform development with water at a temperature of 25° C., followed by drying at 60° C. for 10 minutes. Further, a chemical lamp FL20SBL-360, 20 Watt, was used to perform post-exposure under the same conditions as the main exposure, to obtain a printing plate for evaluating image reproducibility.

The 3% halftone dots with 150 lines per inch formed in a region of 1 cm×1 cm were observed, using a magnifying glass with a magnification of 20 times, and the reproducibility of the halftone dots was evaluated in accordance with the following criteria. When four or more points were scored, the image reproducibility was evaluated as "Pass".

5: No chipping was observed.
4: Chipping was observed in the halftone dots in the region of the outermost peripheral portion.
3: Chipping was observed in the region of the outermost peripheral portion and the region of the second row from the outermost periphery.
2: Chipping was observed in the internal region including the third row from the outermost periphery.
1: Chipping was observed over the area of 20% or more of the total region of the halftone dots.

(5) Printing Durability

The same procedure as the method described in the section (4) above was carried out, except that a negative film containing an outline circular image with a diameter of 12 mm was used, instead of the negative film for evaluating image reproducibility containing a 3% halftone dot image with 150 lines per inch, to obtain a printing plate containing a circular solid portion with a diameter of 12 mm.

Water vapor was applied to the printing surface of each resulting printing plate so that the surface is in a state susceptible to cracks. Thereafter, "BEST CURE" (registered trademark) UV161 Indigo S (manufactured by T&K TOKA Corporation) was printed on double-sided coated papers (manufactured by Maruu Co., Ltd.) with a thickness 90 μm, using an intermittent rotary printing press, LR3 (manufactured by Iwasaki Tekko Co., Ltd.) and under the conditions of a scale of the printing pressure adjustment handle of 5.05 and a printing speed of 100 shots/min. The relief surface of each printing plate was observed after 3,000 impressions, 5,000 impressions, 8,000 impressions and 10,000 impressions, using a loupe with a magnification of 25 times, to evaluate the presence or absence of cracks. The evaluation results are shown in Tables 1 to 3, in which A indicates the case where no crack was observed and B indicates when cracks were observed, after each number of impressions.

Next, the methods of preparing the materials used in each of the Examples and Comparative Examples will be described.

Preparation of Support Having Easily-Adhesive Layer

A mixture of 260 parts by mass of "VYLON" (registered trademark) 31SS (a toluene solution of an unsaturated polyester resin, manufactured by Toyobo Co., Ltd) and 2 parts by mass of PS-8A (benzoin ethyl ether, manufactured by Wako Pure Chemical Industries, Ltd.) was heated at 70° C. for 2 hours. Thereafter, the mixture was cooled to 30° C., and 7 parts by mass of ethylene glycol diglycidyl ether dimethacrylate was added thereto, followed by mixing for 2 hours. To the resulting mixture, 25 parts by mass of "CORONATE" (registered trademark) 3015E (an ethyl acetate solution of a polyvalent isocyanate resin, manufactured by Tosoh Corporation) and 14 parts by mass of EC-1368 (an industrial adhesive agent, manufactured by Sumitomo 3M Limited)

were further added, followed by mixing, to obtain a coating liquid 1 for forming an easily-adhesive layer.

Subsequently, 50 parts by mass of "Gohsenol" (registered trademark) KH-17 (a polyvinyl alcohol with a degree of saponification of from 78.5 to 81.5% by mole, manufactured by Mitsubishi Chemical Corporation) was mixed in a mixed solvent of 200 parts by mass of "SOLMIX" (registered trademark) H-11 (an alcohol mixture, manufactured by Japan Alcohol Trading Co., Ltd.) and 200 parts by mass of water, at 70° C. for 2 hours. Thereafter, 1.5 parts by mass of "BLEMMER" (registered trademark) G (glycidyl methacrylate, manufactured by NOF Corporation) was added thereto, followed by mixing for one hour. To the resulting mixture, 3 parts by mass of a copolymer of dimethylaminoethyl methacrylate and 2-hydroxyethyl methacrylate (manufactured by Kyoeisha Chemical Co., Ltd.) in which the weight ratio (dimethylaminoethyl methacrylate)/(2-hydroxyethyl methacrylate) is 2/1, 5 parts by mass of "Irgacure" (registered trademark) 651 (benzyl methyl ketal, manufactured by Ciba-Geigy AG), 21 parts by mass of Epoxy Ester 70PA (an acrylic acid adduct of propylene glycol diglycidyl ether, manufactured by Kyoeisha Chemical Co., Ltd.) and 20 parts by mass of ethylene glycol diglycidyl ether dimethacrylate were further added, followed by mixing for 90 minutes. After cooling the mixture to 50° C., 0.1 parts by mass of "MEGAFACE" (registered trademark) F-556 (manufactured by DIC Corporation) was added, followed by mixing for 30 minutes, to obtain a coating liquid 2 for forming an easily-adhesive layer.

The coating liquid 1 for forming an easily-adhesive layer was coated on "Lumiler" (registered trademark) T60 (a polyester film, manufactured by Toray Industries, Inc.) with a thickness of 250 μm, using a bar coater, such that the film thickness after drying was 40 m. Thereafter, the coated film was heated in an oven controlled to 180° C. for 3 minutes, to remove the solvents. On the resulting coated film, the coating liquid 2 for forming an easily-adhesive layer was coated such that the dry film thickness was 30 μm, using a bar coater. Thereafter, the coated film was heated in an oven controlled to 160° C. for 3 minutes, to obtain a support having an easily-adhesive layer.

Preparation of Cover Film for Analog Plate

"Gohsenol" (registered trademark) AL-06 (a partially saponified polyvinyl alcohol with a degree of saponification of from 91 to 94% by mole, manufactured by Mitsubishi Chemical Corporation) was coated such that the dry film thickness was 1 μm, on "Lumiler" (registered trademark) S10 (a polyester film, manufactured by Toray Industries, Inc.) with a thickness 100 μm whose surface had been subjected to roughening to achieve a surface roughness Ra of 0.1 to 0.6 μm. Thereafter, the coated film was dried at 100° C. for 25 seconds, to obtain a cover film for an analog plate.

Example 1

A partially saponified polyvinyl alcohol, "Gohsenol" KH-17 (average degree of polymerization: 2,200, degree of saponification: 80% by moles) manufactured by Mitsubishi Chemical Corporation was allowed to swell in acetone, and 3.8 parts by mass of succinic anhydride with respect to 100 parts by mass of the "Gohsenol" KH-17 was added thereto. The mixture was stirred at 60° C. for 6 hours to add a carboxyl group to the molecular chain of the partially saponified polyvinyl alcohol. The resulting polymer was washed with acetone to remove unreacted succinic anhydride, and then dried. A quantity of 100 parts by mass of the resulting polymer was dissolved in 200 parts by mass of a mixed solvent of ethanol and water with a mass ratio of ethanol/water=30/70 at 80° C. To the resulting solution, 6 parts by mass of glycidyl methacrylate was added to introduce an ethylenic double bond to the partially saponified polyvinyl alcohol, to prepare a solution of a-1, which is the component (A-1). The ethylenic double bond equivalent F1 and the weight average molecular weight M1 of the component a-1, as measured by the methods described above were 6,234 g/eq and $1.7\times10^5$, respectively.

Subsequently, the thus obtained component (A-1) and a mixed solvent of ethanol and water with a weight ratio of ethanol/water=30/70 were introduced into a three-neck flask equipped with a spatula for stirring and a condenser tube, in amounts shown in Table 1, and dissolved by heating at 90° C. for 2 hours. After cooling the resulting mixture to 70° C., other components shown in Table 1 were added thereto, followed by stirring for 30 minutes, to obtain a solution for forming the first layer.

Thereafter, a partially saponified polyvinyl alcohol, "Gohsenol" KL-05 (average degree of polymerization: 500, degree of saponification: 80% by moles) manufactured by Mitsubishi Chemical Corporation was allowed to swell in acetone, and 4.2 parts by mass of succinic anhydride with respect to 100 parts by mass of the "Gohsenol" KL-05 was added thereto. The mixture was stirred at 60° C. for 6 hours to add a carboxyl group to the molecular chain of the partially saponified polyvinyl alcohol. The resulting polymer was washed with acetone to remove unreacted succinic anhydride, and then dried. A quantity of 100 parts by mass of the resulting polymer was dissolved in 200 parts by mass of a mixed solvent of ethanol and water with a mass ratio of ethanol/water=30/70 at 80° C. To the resulting solution, 6 parts by mass of glycidyl methacrylate was added to introduce an ethylenic double bond to the partially saponified polyvinyl alcohol, to prepare a solution of a-2, which is the component (A-2). The ethylenic double bond equivalent F2 of the resulting component a-2 was 5,611 g/eq, and the weight average molecular weight M2 thereof was $0.4\times10^5$.

A solution for forming the second layer was obtained in the same manner as the preparation of the solution for forming the first layer, except that the component (A-2) was used instead of the component (A-1).

The solution for forming the second layer obtained as described above was coated by flow casting on the above-described support having an easily-adhesive layer, on the side thereof provided with the easily-adhesive layer, and dried at 60° C. for 2.5 hours to form the second layer. At this time, the coating was controlled such that the plate thickness (the total thickness of the polyester film and the photosensitive resin layer) after drying was 0.90 mm. Then the solution for forming the first layer was coated by flow casting on the second layer, and dried at 60° C. for one hour, to form the first layer including the printing surface. At this time, the coating was controlled such that the plate thickness (the total thickness of the polyester film and the photosensitive resin layer) after drying was 0.95 mm.

A mixed solvent of water and ethanol with a mass ratio of water/ethanol=50/50 was coated on the thus obtained photosensitive resin layer, and the above-described cover film for an analog plate was adhered to the coated surface with a pressure, to obtain a printing plate precursor. The properties of the printing plate were evaluated by the methods described above, using the thus obtained printing plate precursor, and the evaluated results are shown in Table 1.

Example 2

A printing plate precursor was obtained in the same manner as in Example 1, except that a component a-3 (F2:

2,158 g/eq, M2: $1.7\times10^5$) obtained by using "Gohsenol" KH-17 and by changing the amount of succinic anhydride to be added to 10.9 parts by mass, was used as the component (A-2) in the solution for forming the second layer.

Example 3

A printing plate precursor was obtained in the same manner as in Example 2, except that the component a-2 described above was used as the component (A-1) in the solution for forming the first layer.

Example 4

A printing plate precursor was obtained in the same manner as in Example 1, except that a component a-4 (F1: 22,444 g/eq, M1: $1.7\times10^5$) obtained by changing the amount of succinic anhydride to be added to 0.8 parts by mass, was used as the component (A-1) in the solution for forming the first layer.

Example 5

A photosensitive resin printing plate precursor was obtained in the same manner as in Example 2, except that a component a-5 (F1: 18,703 g/eq, M1: $1.7\times10^5$) obtained by changing the amount of succinic anhydride to be added to 1.3 parts by mass, was used as the component (A-1) in the solution for forming the first layer.

Example 6

A quantity of 10 parts by mass of F-caprolactam, 90 parts by mass of a Nylon salt of N-(2-aminoethyl)piperazine and adipic acid, and 100 parts by mass of water were introduced into a stainless steel autoclave. After replacing the air in the interior of the autoclave with a nitrogen gas, the mixture was heated at 180° C. for one hour, followed by removing water, to obtain a polyamide resin containing a tertiary nitrogen atom. A quantity of 100 parts by mass of the resulting polymer was dissolved in 200 parts by mass of a mixed solvent of ethanol and water with a mass ratio of ethanol/water=30/70 at 80° C. To the resulting solution, 2 parts by mass of glycidyl methacrylate was added to introduce an ethylenic double bond to the polyamide resin containing a tertiary nitrogen atom, to prepare a solution of a-6, which is the component (A-1). The ethylenic double bond equivalent F1 and the weight average molecular weight M1 of the component a-6, as measured by the methods described above were 3,289 g/eq and $1.2\times10^5$, respectively.

Further, 100 parts by mass of the above-described polyamide resin containing a tertiary nitrogen atom was dissolved in 200 parts by mass of a mixed solvent of ethanol and water with a weight ratio of ethanol/water=30/70 at 80° C. To the resulting solution, 3 parts by mass of glycidyl methacrylate was added to introduce an ethylenic double bond to the polyamide resin containing a tertiary nitrogen atom, to prepare a solution of a-7, which is the component (A-2). The ethylenic double bond equivalent F2 of the resulting component a-7 was 1,315 g/eq, and the weight average molecular weight M2 thereof was $1.2\times10^5$.

A printing plate precursor was obtained in the same manner as in Example 1, except that the thus obtained components (A-1) and (A-2) were used.

Comparative Example 1

A printing plate precursor was obtained in the same manner as in Example 1, except that a component a-8 (F1: 5,611 g/eq, M1: $1.7\times10^5$) obtained by changing the amount of succinic anhydride to be added to 4.2 parts by mass, was used as the component (A-1) in the solution for forming the first layer.

Comparative Example 2

A printing plate precursor was obtained in the same manner as in Example 1, except that the component a-3 described above was used as the component (A-1) in the solution for forming the first layer.

Comparative Example 3

A photosensitive resin printing plate precursor was obtained in the same manner as in Example 3, except that the component a-5 described above was used as the component (A-2) in the solution for forming the second layer.

The compositions of the photosensitive resin layers of the respective Examples and Comparative Examples and evaluation results are shown in Tables 1 to 3.

TABLE 1

| | Component | Material Name | Example 1 | Example 2 | Example 3 |
|---|---|---|---|---|---|
| First layer Content (parts by mass) | (A) | Ethylenic double bond-containing polymer (A-1) (See below) | 60 | 60 | 60 |
| | (B) | Glycerol dimethacrylate | 7 | 7 | 7 |
| | | Acrylic acid adduct of propylene glycol diglycidyl ether | 12 | 12 | 12 |
| | | Tetrahydrofurfuryl methacrylate | 11 | 11 | 11 |
| | (C) | 2,2-Dimethoxy-1,1-diphenylethan-1-one | 1.3 | 1.3 | 1.3 |
| | Compatibility aid | Pentaerythritol polyoxyethylene ether | 10 | 10 | 10 |
| | Polymerization inhibitor | N-(ammoniumoxy)-N-nitrosophenylamine | 0.1 | 0.1 | 0.1 |
| Second layer Content (parts by mass) | (A) | Ethylenic double bond-containing polymer (A-2) (See below) | 60 | 60 | 60 |
| | (B) | Glycerol dimethacrylate | 7 | 7 | 7 |
| | | Acrylic acid adduct of propylene glycol diglycidyl ether | 12 | 12 | 12 |
| | | Tetrahydrofurfuryl methacrylate | 11 | 11 | 11 |

TABLE 1-continued

| | Component | Material Name | Example 1 | Example 2 | Example 3 |
|---|---|---|---|---|---|
| | (C) | 2,2-Dimethoxy-1,1-diphenylethan-1-one | 1.3 | 1.3 | 1.3 |
| | Compatibility aid | Pentaerythritol polyoxyethylene ether | 10 | 10 | 10 |
| | Polymerization inhibitor | N-(ammoniumoxy)-N-nitrosophenylamine | 0.1 | 0.1 | 0.1 |
| Component (A) | (A-1) | F1 [g/eq] | 6,234 | 6,234 | 5,611 |
| | | M1 | $1.7 \times 10^5$ | $1.7 \times 10^5$ | $0.4 \times 10^5$ |
| | (A-2) | F2 [g/eq] | 5,611 | 2,158 | 2,158 |
| | | M2 | $0.4 \times 10^5$ | $1.7 \times 10^5$ | $1.7 \times 10^5$ |
| | | F1/F2 | 1.1 | 2.9 | 2.6 |
| | | M1/M2 | 4.3 | 1.0 | 0.24 |
| Evaluation results | Delamination of photosensitivity resin layer | | Absent | Absent | Absent |
| | Image reproducibility | Points | 5 | 5 | 5 |
| | | Evaluation | Pass | Pass | Pass |
| | Printing durability | 3,000 impressions | A | A | A |
| | | 5,000 impressions | A | A | A |
| | | 8,000 impressions | A | A | B |
| | | 10,000 impressions | A | A | B |

TABLE 2

| | Component | Material Name | Example 4 | Example 5 | Example 6 |
|---|---|---|---|---|---|
| First layer Content (parts by mass) | (A) | Ethylenic double bond-containing polymer (A-1) (See below) | 60 | 60 | 60 |
| | (B) | Glycerol dimethacrylate | 7 | 7 | 7 |
| | | Acrylic acid adduct of propylene glycol diglycidyl ether | 12 | 12 | 12 |
| | | Tetrahydrofurfuryl methacrylate | 11 | 11 | 11 |
| | (C) | 2,2-Dimethoxy-1,1-diphenylethan-1-one | 1.3 | 1.3 | 1.3 |
| | Compatibility aid | Pentaerythritol polyoxyethylene ether | 10 | 10 | 10 |
| | Polymerization inhibitor | N-(ammoniumoxy)-N-nitrosophenylamine | 0.1 | 0.1 | 0.1 |
| Second layer Content (parts by mass) | (A) | Ethylenic double bond-containing polymer (A-2) (See below) | 60 | 60 | 60 |
| | (B) | Glycerol dimethacrylate | 7 | 7 | 7 |
| | | Acrylic acid adduct of propylene glycol diglycidyl ether | 12 | 12 | 12 |
| | | Tetrahydrofurfuryl methacrylate | 11 | 11 | 11 |
| | (C) | 2,2-Dimethoxy-1,1-diphenylethan-1-one | 1.3 | 1.3 | 1.3 |
| | Compatibility aid | Pentaerythritol polyoxyethylene ether | 10 | 10 | 10 |
| | Polymerization inhibitor | N-(ammoniumoxy)-N-nitrosophenylamine | 0.1 | 0.1 | 0.1 |
| Component (A) | (A-1) | F1 [g/eq] | 22,444 | 18,703 | 3,289 |
| | | M1 | $1.7 \times 10^5$ | $1.7 \times 10^5$ | $1.2 \times 10^5$ |
| | (A-2) | F2 [g/eq] | 5,611 | 2,158 | 1,315 |
| | | M2 | $0.4 \times 10^5$ | $1.7 \times 10^5$ | $1.2 \times 10^5$ |
| | | F1/F2 | 4.0 | 8.7 | 2.5 |
| | | M1/M2 | 4.3 | 1.0 | 1.0 |
| Evaluation results | Delamination of photosensitivity resin layer | | Absent | Absent | Absent |
| | Image reproducibility | Points | 4 | 4 | 4 |
| | | Evaluation | Pass | Pass | Pass |
| | Printing durability | 3,000 impressions | A | A | A |
| | | 5,000 impressions | A | A | A |
| | | 8,000 impressions | A | A | A |
| | | 10,000 impressions | A | A | A |

TABLE 3

| | Component | Material Name | Comparative Example 1 | Comparative Example 2 | Comparative Example 3 |
|---|---|---|---|---|---|
| First layer Content (parts by mass) | (A) | Ethylenic double bond-containing polymer (A-1) (See below) | 60 | 60 | 60 |
| | (B) | Glycerol dimethacrylate | 7 | 7 | 7 |
| | | Acrylic acid adduct of propylene glycol diglycidyl ether | 12 | 12 | 12 |
| | | Tetrahydrofurfuryl methacrylate | 11 | 11 | 11 |
| | (C) | 2,2-Dimethoxy-1,1-diphenylethan-1-one | 1.3 | 1.3 | 1.3 |
| | Compatibility aid | Pentaerythritol polyoxyethylene ether | 10 | 10 | 10 |
| | Polymerization inhibitor | N-(ammoniumoxy)-N-nitrosophenylamine | 0.1 | 0.1 | 0.1 |
| Second layer Content (parts by mass) | (A) | Ethylenic double bond-containing polymer (A-2) (See below) | 60 | 60 | 60 |
| | (B) | Glycerol dimethacrylate | 7 | 7 | 7 |
| | | Acrylic acid adduct of propylene glycol diglycidyl ether | 12 | 12 | 12 |
| | | Tetrahydrofurfuryl methacrylate | | 11 | 11 |
| | (C) | 2,2-Dimethoxy-1,1-diphenylethan-1-one | 1.3 | 1.3 | 1.3 |
| | Compatibility aid | Pentaerythritol polyoxyethylene ether | 10 | 10 | 10 |
| | Polymerization inhibitor | N-(ammoniumoxy)-N-nitrosophenylamine | 0.1 | 0.1 | 0.1 |
| Component (A) | (A-1) | F1 [g/eq] | 5,611 | 2,158 | 5,611 |
| | | M1 | $1.7 \times 10^5$ | $1.7 \times 10^5$ | $0.4 \times 10^5$ |
| | (A-2) | F2 [g/eq] | 5,611 | 5,611 | 18,703 |
| | | M2 | $0.4 \times 10^5$ | $0.4 \times 10^5$ | $1.7 \times 10^5$ |
| | | F1/F2 | 1.0 | 0.4 | 0.3 |
| | | M1/M2 | 4.3 | 4.3 | 0.24 |
| Evaluation results | Delamination of photosensitivity resin layer | | Present | Present | Present |
| | Image reproducibility | Points | 5 | 5 | 5 |
| | | Evaluation | Pass | Pass | Pass |
| | Printing durability | 3,000 impressions | A | A | A |
| | | 5,000 impressions | A | A | A |
| | | 8,000 impressions | A | A | B |
| | | 10,000 impressions | A | A | B |

The invention claimed is:

1. A photosensitive resin printing plate precursor comprising at least a support and a photosensitive resin layer, wherein said photosensitive resin layer comprises at least a first photosensitive resin layer including a printing surface, and a second photosensitive resin layer including an interior of said photosensitive resin layer, each of said first and second photosensitive resin layers comprising a polymer (A) having an ethylenic double bond, a compound (B) having an ethylenic double bond, and a photopolymerization initiator (C); and an ethylenic double bond equivalent F1 (g/eq) of polymer (A) in said first photosensitive resin layer, which is component A-1, is higher than the ethylenic double bond equivalent F2 (g/eq) of polymer (A) in said second photosensitive resin layer, which is A-2;

wherein the ethylenic double bond equivalents F1 and F2 each have the unit g/eq; and wherein the ethylenic double bond equivalents are measured using a method in which the number of moles of ethylenic double bonds in the polymer is analyzed using 1H-NMR, and the weight of a sample used in the analysis is divided by the number of moles of ethylenic double bonds detected;

wherein a weight average molecular weight M1 of said component (A-1) is equal to or higher than a weight average molecular weight M2 of said component (A-2); and wherein said M1 is 20,000 or more and 200,000 or less.

2. The photosensitive resin printing plate precursor according to claim 1, wherein said F1 is 1,000 (g/eq) or more and 19,000 (g/eq) or less.

3. The photosensitive resin printing plate precursor according to claim 1, wherein the ratio (F1/F2) of said F1 to said F2 is more than 1.0 and 5.0 or less.

4. The photosensitive resin printing plate precursor according to claim 1, wherein the ratio (M1/M2) of said M1 to said M2 is 1.0 or more and 6.5 or less.

5. The photosensitive resin printing plate precursor according to claim 1, wherein said first photosensitive resin layer and said second photosensitive resin layer are adjacent to each other.

6. The photosensitive resin printing plate precursor according to claim 1, wherein said first photosensitive resin layer has a thickness of 5 μm or more and 100 μm or less.

7. The photosensitive resin printing plate precursor according to claim 1, wherein said second photosensitive resin layer has a thickness of 100 μm or more and 2.0 mm or less.

8. The photosensitive resin printing plate precursor according to claim 1, wherein said photosensitive resin layer comprises polyvinyl alcohol, a partially saponified polyvinyl alcohol and/or a tertiary nitrogen atom-containing polyamide, as said polymer (A).

9. A method of producing a printing plate, using the photosensitive resin printing plate precursor according to claim 1, the method comprising:

an exposure step of irradiating UV light to at least said photosensitive resin layer of said photosensitive resin printing plate precursor, to photocure the exposed portion of said photosensitive resin layer; and a development step of removing the uncured portion of said photosensitive resin layer, using at least water and/or an organic solvent.

10. The method of producing a printing plate according to claim 9, wherein said uncured portion is dissolved by a brush washing machine, in the development step.

11. The method of producing a printing plate according to claim 9, wherein said printing plate is adapted for dry offset printing.

12. A dry offset printing method comprising printing on a two-piece metal can using a printing plate obtained by the method of producing a printing plate according to claim 11.

13. The photosensitive resin printing plate precursor according to claim 1, wherein said polymer (A) has an ethylenic double bond in a side chain.

* * * * *